(12) United States Patent
Hattori

(10) Patent No.: US 11,348,733 B2
(45) Date of Patent: May 31, 2022

(54) CHIP ELECTRONIC COMPONENT, ELECTRONIC COMPONENT MOUNTING STRUCTURE AND ELECTRONIC COMPONENT ASSEMBLY

(71) Applicant: Murata Manufacturing Co., Ltd., Nagaokakyo (JP)

(72) Inventor: Kazuo Hattori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/930,352

(22) Filed: Jul. 16, 2020

(65) Prior Publication Data

US 2021/0035742 A1 Feb. 4, 2021

(30) Foreign Application Priority Data

Jul. 31, 2019 (JP) .............................. JP2019-140536

(51) Int. Cl.
*H01G 4/30* (2006.01)
*H01G 4/012* (2006.01)
(Continued)

(52) U.S. Cl.
CPC ............... *H01G 4/30* (2013.01); *H01G 4/012* (2013.01); *H01G 4/248* (2013.01); *H05K 1/181* (2013.01); *H05K 2201/10015* (2013.01)

(58) Field of Classification Search
CPC .......... H01G 4/30; H01G 4/012; H01G 4/248; H01G 4/002–015; H01G 2/06;
(Continued)

(56) References Cited

U.S. PATENT DOCUMENTS 4,771,159 A * 9/1988 O'Leary .............. H05K 3/3485
219/85.22
8,988,850 B1 * 3/2015 Kodama .................. H01G 4/30
361/301.4
(Continued)

FOREIGN PATENT DOCUMENTS

CN 102970825 A 3/2013
CN 104576052 A 4/2015
(Continued)

OTHER PUBLICATIONS

Official Communication issued in corresponding Chinese Patent Application No. 202010747585.9 dated Sep. 27, 2021.
(Continued)

*Primary Examiner* — Roshn K Varghese
(74) *Attorney, Agent, or Firm* — Keating & Bennett, LLP

(57) ABSTRACT

A multilayer ceramic capacitor includes a multilayer body having a rectangular parallelepiped shape. A first external electrode is disposed on at least a first end surface and a first main surface of the multilayer body. A second external electrode is disposed on at least a second end surface and a first main surface of the multilayer body. A first joining member is electrically connected to the first external electrode. A second joining member is electrically connected to the second external electrode. Each of the first joining member and the second joining member includes a plurality of spherical cores.

16 Claims, 6 Drawing Sheets

(51) Int. Cl.
*H05K 1/18* (2006.01)
*H01G 4/248* (2006.01)

(58) Field of Classification Search
CPC .......... H01G 2/10; H01G 4/232; H01G 4/228;
H01G 4/224; H01G 4/40; H05K 1/181;
H05K 2201/10015; H05K 3/3478; H05K
3/3442; H05K 13/0084; Y02P 70/50
See application file for complete search history.

(56) References Cited

U.S. PATENT DOCUMENTS

| | | | |
|---|---|---|---|
| 2002/0100986 A1* | 8/2002 | Soga | H01L 24/32 |
| | | | 257/779 |
| 2005/0006442 A1 | 1/2005 | Stillabower | |
| 2012/0208040 A1* | 8/2012 | Lien | H01G 4/30 |
| | | | 428/552 |
| 2013/0056252 A1* | 3/2013 | Fujii | H05K 1/0216 |
| | | | 174/260 |
| 2014/0063683 A1* | 3/2014 | Gu | H01G 4/30 |
| | | | 361/301.4 |
| 2014/0076621 A1 | 3/2014 | Arnold et al. | |
| 2015/0122537 A1 | 5/2015 | Yamada | |
| 2015/0170786 A1* | 6/2015 | Hong | H01G 2/065 |
| | | | 174/260 |
| 2016/0172108 A1* | 6/2016 | Ikeda | H01G 4/2325 |
| | | | 361/301.4 |
| 2019/0287719 A1 | 9/2019 | Fujita et al. | |
| 2019/0295773 A1* | 9/2019 | Kim | H01G 4/30 |

FOREIGN PATENT DOCUMENTS

| | | |
|---|---|---|
| FR | 2 706 139 A1 | 12/1994 |
| JP | 2015-111647 A | 6/2015 |
| KR | 10-2014-0032294 A | 3/2014 |
| KR | 10-2015-0048045 A | 5/2015 |
| KR | 10-2017-0118584 A | 10/2017 |
| KR | 10-2017-0130290 A | 11/2017 |
| KR | 10-2019-0059972 A | 5/2019 |

OTHER PUBLICATIONS

Official Communication issued in corresponding Korean Patent Application No. 10-2020-0086531, dated Feb. 11, 2022.
Official Communication issued in corresponding Japanese Patent Application No. 2019-140536, dated Mar. 2022.

* cited by examiner

CHIP ELECTRONIC COMPONENT, ELECTRONIC COMPONENT MOUNTING STRUCTURE AND ELECTRONIC COMPONENT ASSEMBLY

CROSS REFERENCE TO RELATED APPLICATIONS

This application claims the benefit of priority to Japanese Patent Application No. 2019-140536 filed on Jul. 31, 2019. The entire contents of this application are hereby incorporated herein by reference.

BACKGROUND OF THE INVENTION

1. Field of the Invention

The present invention relates to a chip electronic component, an electronic component mounting structure, and an electronic component assembly.

2. Description of the Related Art

In a multilayer ceramic capacitor as one example of a chip electronic component, application of a voltage between external electrodes causes dielectric polarization between adjacent internal electrodes that face each other. The capacitance resulting from this dielectric polarization can be extracted through the external electrodes.

A dielectric contributing to formation of the capacitance resulting from the internal electrodes facing each other as described above causes electric field-induced strain in accordance with the applied voltage. When a multilayer ceramic capacitor is surface-mounted on a substrate, the electric field-induced strain causes the multilayer ceramic capacitor to deform the substrate, and the frequency of this deformation produces a sound, called "squeal". A larger "squeal" causes a noise problem.

For example, in order to suppress such squeal for solving the above-described problem, a proposal has been made to configure an electronic component such that the component is offset in height from a substrate 3 by forming a spherically-shaped electrically conductive structure 2 on a mounting surface of a capacitor 1 so as to suppress wetting of solder, as shown in FIG. 10 (see, for example, the specification of US Patent Application Publication No. 2014/0076621).

This electrically conductive structure 2 is mechanically and electrically coupled to electrodes disposed at both ends of the capacitor. Electrically conductive structure 2 can be disposed at a corner where the amplitude of vibration caused by piezoelectric power is relatively small. Then, by soldering an electrically conductive structure onto a land pattern on a PCB, mechanical and electrical connection can be formed while reducing the amount of vibration energy transmitted from capacitor 1 to substrate 3.

In the configuration offset from the substrate by electrically conductive structure 2 as disclosed in the specification of US Patent Application Publication No. 2014/0076621, it is difficult to accurately dispose electrically conductive structure 2 at a prescribed position in the case where capacitor 1 is small in size. Furthermore, conductive lands on capacitor 1 and the substrate are joined only by electrically conductive structure 2, which causes a problem of weak bonding strength.

SUMMARY OF THE INVENTION

Preferred embodiments of the present invention provide chip electronic components, electronic component mounting structures, and electronic component assemblies, in each of which a joining member including a plurality of spherical cores is disposed on an electronic component main body, so as to reduce or prevent squealing and improve the mounting stability.

A chip electronic component according to a preferred embodiment of the present invention includes a multilayer body including a plurality of ceramic layers that are stacked on one another, and a plurality of internal electrodes that are stacked on the respective ceramic layers, the multilayer body including a first main surface and a second main surface that face each other in a height direction, a first side surface and a second side surface that face each other in a width direction orthogonal or substantially orthogonal to the height direction, and a first end surface and a second end surface that face each other in a length direction orthogonal or substantially orthogonal to the height direction and the width direction; a first external electrode disposed on at least the first end surface and the first main surface of the multilayer body; a second external electrode disposed on at least the second end surface and the first main surface of the multilayer body; a first joining member electrically connected to the first external electrode; and a second joining member electrically connected to the second external electrode. The first joining member is disposed on a portion of at least the first external electrode that is disposed on the first main surface. The second joining member is disposed on a portion of at least the second external electrode that is disposed on the first main surface. Each of the first joining member and the second joining member includes a plurality of spherical cores.

In a chip electronic component according to a preferred embodiment of the present invention, the first joining member is electrically connected to the first external electrode, the second joining member is electrically connected to the second external electrode, and each of the first joining member and the second joining member includes the spherical cores. Thus, when this chip electronic component is mounted on a mounting substrate with solder, an electronic component main body can be mount horizontally to the mounting substrate, and also can be mounted offset in the height direction. Accordingly, the squeal reducing or preventing effect is able to be achieved. Also, since the electronic component main body is supported by the plurality of spherical cores, the mounting stability is able to be improved.

According to preferred embodiments of the present invention, chip electronic components, electronic component mounting structures, and electronic component assemblies are provided, in each of which a joining member including a plurality of spherical cores is disposed on an electronic component main body, so as to reduce or prevent squealing and improve the mounting stability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

1. Chip Electronic Component

Figure 1:
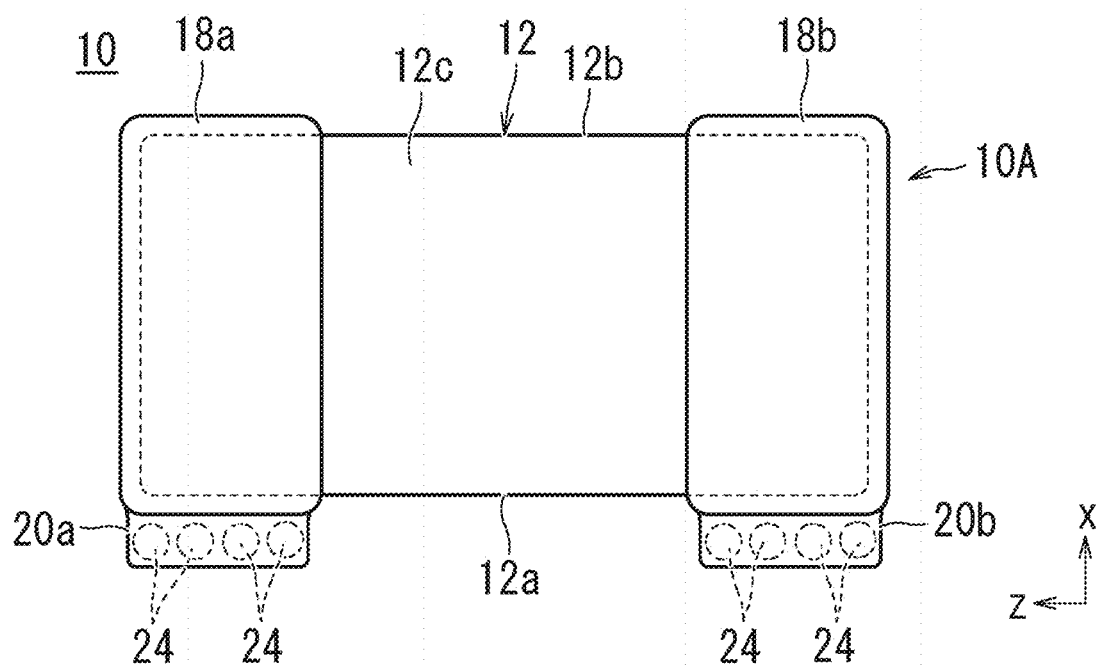
FIG. 1 is a side view of an example of a chip electronic component according to a preferred embodiment of the present invention.
Figure 2:
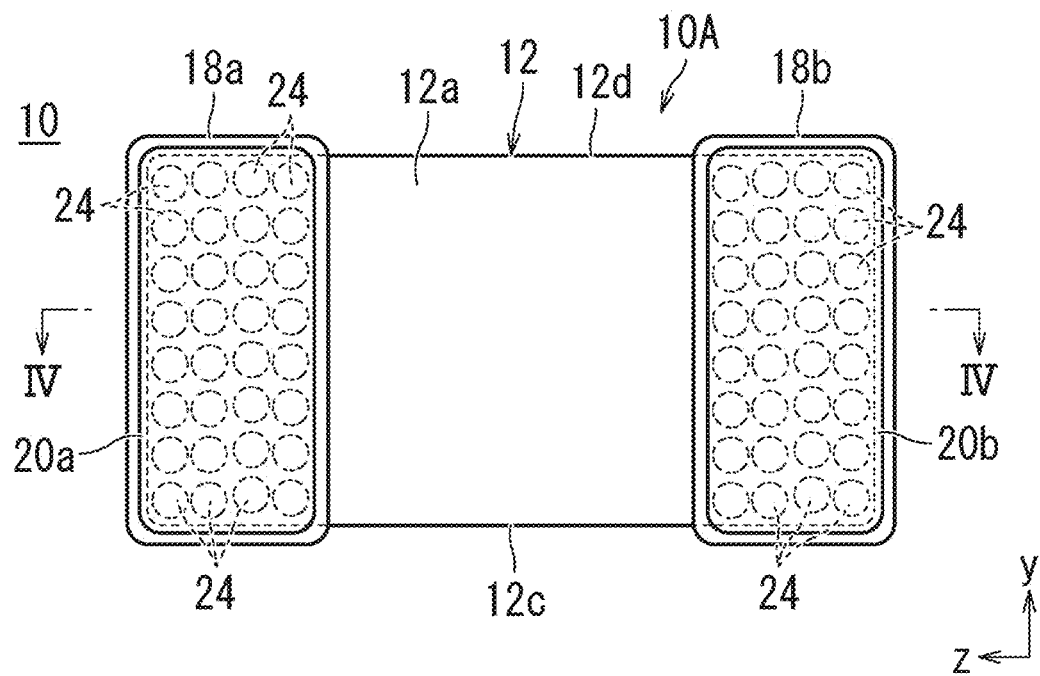
FIG. 2 is a bottom view of FIG. 1 showing a chip electronic component according to a preferred embodiment of the present invention.
Figure 3:
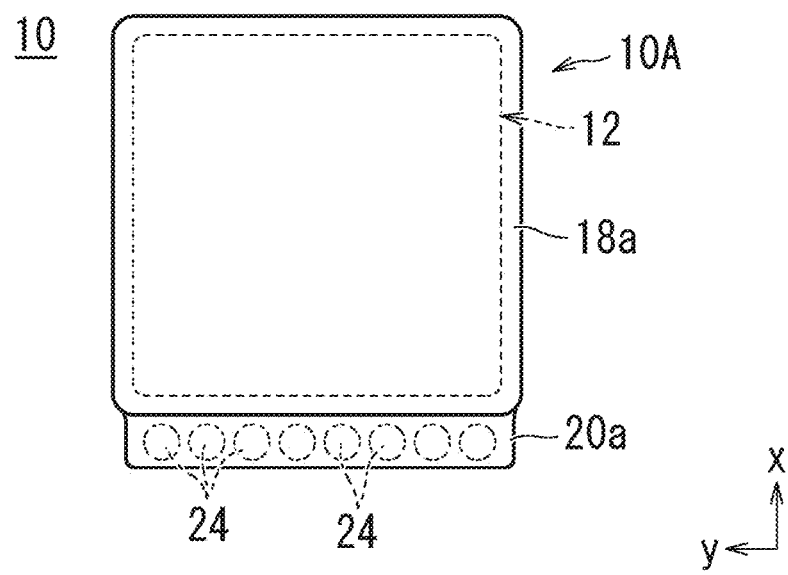
FIG. 3 is an end view of FIG. 1 showing a chip electronic component according to a preferred embodiment of the present invention.

Referring to FIGS. 1 to 4, a chip electronic component 10 according to a preferred embodiment of the present invention will be described. In the present preferred embodiment, chip electronic component 10 includes a multilayer ceramic capacitor as an electronic component main body 10A.

Chip electronic component 10 includes electronic component main body 10A. Electronic component main body 10A includes a chip multilayer body 12. Multilayer body 12 has, for example, a rectangular or substantially rectangular parallelepiped shape. Multilayer body 12 includes a first main surface 12a and a second main surface 12b that face each other, a first side surface 12c and a second side surface 12d that face each other, and a first end surface 12e and a second end surface 12f that face each other. First side surface 12c and second side surface 12d connect first main surface 12a and second main surface 12b. First end surface 12e and second end surface 12f connect first main surface 12a and second main surface 12b. Multilayer body 12 having a rectangular or substantially rectangular parallelepiped shape includes ridges and corners, each of which is rounded.

Here, the direction along a line connecting first main surface 12a and second main surface 12b of multilayer body 12 is defined as a height direction x. The direction along a line connecting first side surface 12c and second side surface 12d and orthogonal or substantially orthogonal to height direction x is defined as a width direction y. The direction along a line connecting first end surface 12e and second end surface 12f and orthogonal or substantially orthogonal to height direction x and width direction y is defined as a length direction z. These terms defined as above will be used in the following description.

Also, the dimension of multilayer body 12 in height direction x is defined as a T dimension. The dimension of multilayer body 12 in width direction y is defined as a W dimension. The dimension of multilayer body 12 in length direction z is defined as an L dimension.

Figure 4:
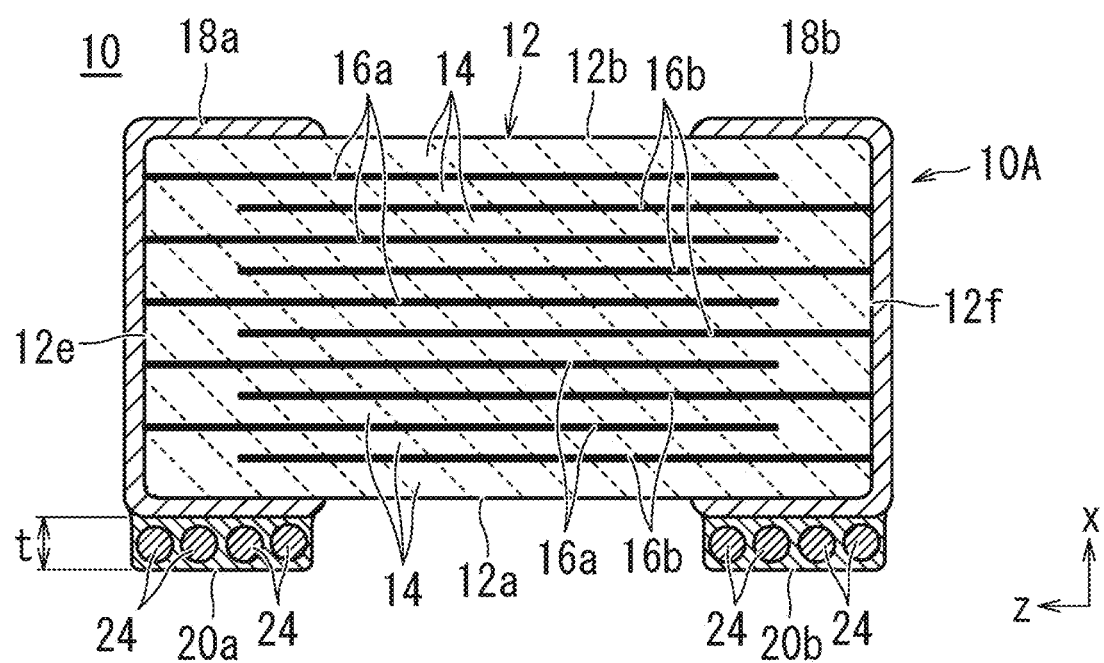
FIG. 4 is a cross-sectional view of the chip electronic component taken along a line IV-IV in FIG. 2.

As shown in FIG. 4, multilayer body 12 includes a plurality of stacked ceramic layers 14, and a plurality of first internal electrodes 16a and a plurality of second internal electrodes 16b, each of which is provided along an interface between ceramic layers 14. Each ceramic layer 14 is preferably made of a dielectric ceramic, for example. Each first internal electrode 16a and each second internal electrode 16b preferably includes Ni as a conductive component, for example. First internal electrode 16a and second internal electrode 16b may further include the same composition-based dielectric particles as those of ceramic contained in ceramic layer 14.

Internal electrodes 16a and 16b include edges exposed to one of end surfaces 12e and 12f of multilayer body 12. In this configuration, first internal electrodes 16a exposed to first end surface 12e of multilayer body 12 and second internal electrodes 16b exposed to second end surface 12f are alternately disposed within multilayer body 12 so as to enable capacitances to be obtained via ceramic layers 14. Furthermore, it is preferable that internal electrodes 16a and 16b are disposed in parallel or substantially in parallel with first main surface 12a.

In order to extract the above-described capacitances, a first external electrode 18a and a second external electrode 18b are provided on first end surface 12e and second end surface 12f, respectively, of multilayer body 12 that face each other. First external electrode 18a is electrically connected to first internal electrodes 16a. Second external electrode 18b is electrically connected to second internal electrodes 16b. External electrodes 18a and 18b each include a baked layer provided thereon, for example, by baking of a conductive paste including metal as a conductive component. The baked layer is plated with, for example, Ni, Sn and the like, as required. Examples of the metal for the baked layer may be at least one selected from among Cu, Ni, Ag, Pd, an Ag—Pd alloy, Au, and the like. The baked layer may include glass. The glass of the baked layer includes, for example, at least one selected from among B, Si, Ba, Mg, Al, Li, and the like.

First external electrode 18a is not only provided on first end surface 12e of multilayer body 12, but also extends to a portion of each of first main surface 12a and second main surface 12b that is located adjacent to first end surface 12e and extends to a portion of each of first side surface 12c and second side surface 12d that is located adjacent to first end surface 12e.

Second external electrode 18b is not only provided on second end surface 12f of multilayer body 12, but also extends to a portion of each of first main surface 12a and second main surface 12b that is located adjacent to second end surface 12f and extends to a portion of each of first side surface 12c and second side surface 12d that is located adjacent to second end surface 12f.

Figure 5A:
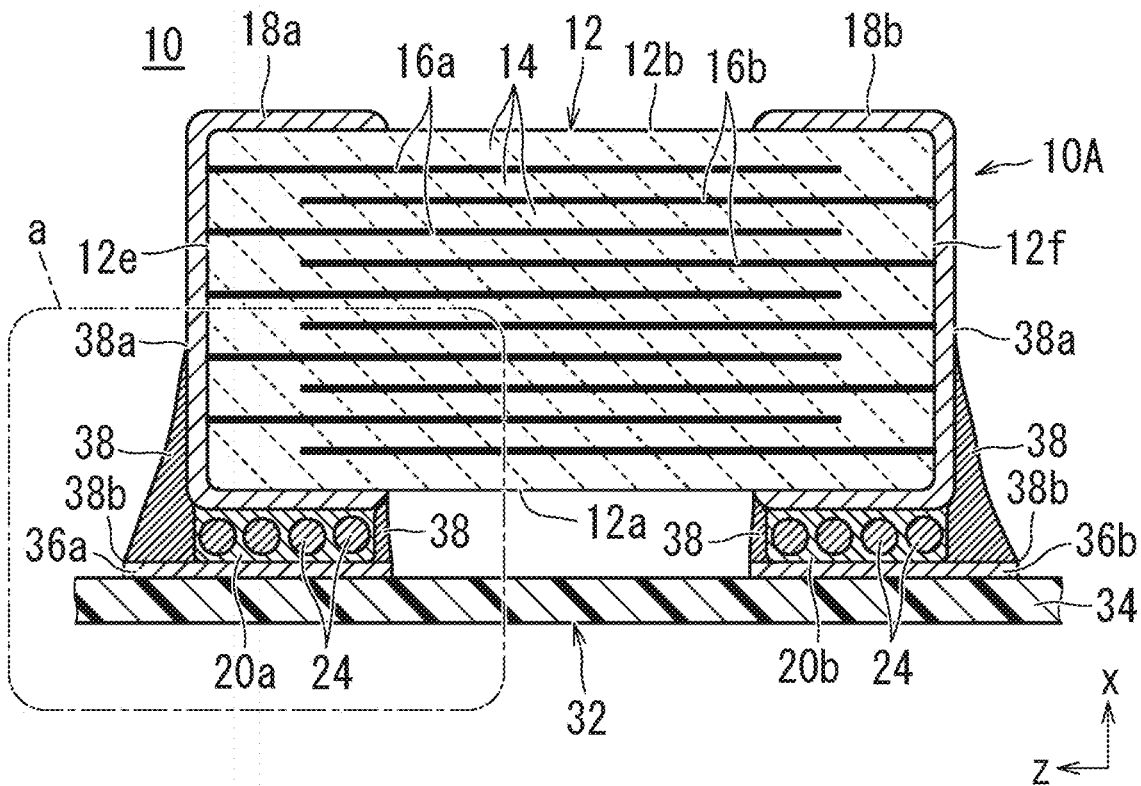
FIG. 5A is a cross-sectional view showing an electronic component mounting structure in which a chip electronic component according to a preferred embodiment of the present invention is mounted on a mounting substrate.
Figure 5B:
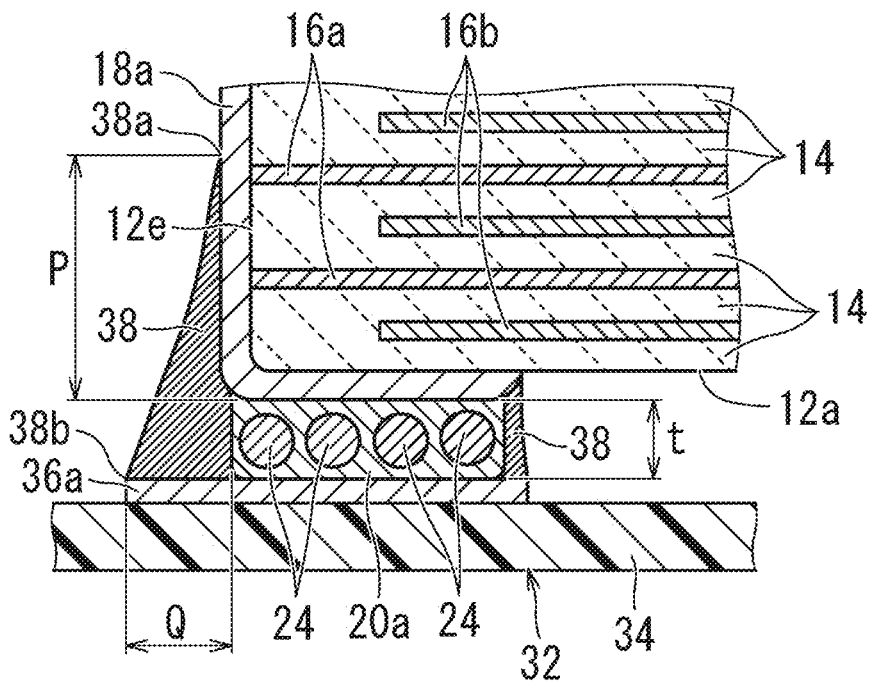
FIG. 5B is an enlarged cross-sectional view (an enlarged view of a section a) of a joining portion between an external electrode and a joining member.

In chip electronic component 10, first main surface 12a is a mounting surface that faces the mounting substrate 32 side, as shown in FIGS. 5A and 5B. Thus, in the following description, a reference character "12a" will refer to both the "first main surface" and the "mounting surface".

First joining member 20a is disposed on a portion of at least first external electrode 18a that is disposed on first main surface (mounting surface) 12a. Also, second joining member 20b is disposed on a portion of at least second external electrode 18b that is disposed on first main surface (mounting surface) 12a.

First joining member 20a and second joining member 20b are each preferably made of a solder material. The solder material is preferably made, for example, using Sn—Sb based, Sn—Ag—Cu based, Sn—Cu based, or Sn—Bi based LF solder. The melting point of the solder material is preferably lower than about 300° C., for example. Thus, after chip electronic component 10 is reflow-mounted on mounting substrate 32, the mounting position can be corrected again. Furthermore, Sn in the solder material defining first joining member 20a and second joining member 20b combines with Sn in the Sn plating of external electrodes 18a and 18b.

As shown in FIG. 4, first joining member 20a and second joining member 20b each include a plurality of spherical cores 24. Each spherical core 24 is preferably made of metal such as Cu and Ni, a resin, or the like, for example. The average grain size of spherical cores 24 is preferably equal to or greater than about 25 μm and equal to or less than about 100 μm, for example. This more effectively reduces or prevents the squealing effect occurring when electronic component main body 10A is mounted on mounting substrate 32.

When spherical cores 24 each are made of a resin, the surface of each spherical core 24 may be plated with metal. This improves the wettability (affinity) between the solder material forming first joining member 20a and second joining member 20b, and spherical cores 24 each made of a metal-plated resin, to thus improve the joining strength, with the result that the mounting stability in mounting chip electronic component 10 on a substrate is improved.

Furthermore, it is preferable that spherical cores 24 are not provided at a position higher than electronic component main body 10A.

Furthermore, it is preferable that the variation in diameter of spherical cores 24 is, for example, equal to or less than about 50%. For example, when the average grain size of spherical cores 24 is about 100 μm, the grain sizes of spherical cores 24 contained in first joining member 20a and second joining member 20b fall within a range of about 50 μm or more and about 150 μm or less. As spherical cores 24 having an average grain size in a prescribed range are included, the variation in grain size of spherical cores 24 is reduced or prevented, with the result that the mounting stability in mounting chip electronic component 10 on a substrate is improved. However, some of spherical cores 24 may have an elliptical shape that is slightly deformed from a perfect sphere.

Spherical core 24 can be detected by WDX (wavelength dispersive X-ray spectroscopy), for example.

As shown in FIG. 4, first joining member 20a and second joining member 20b each have a prescribed thickness-direction dimension (joining thickness) t on mounting surface 12a that is measured in the direction perpendicular or substantially perpendicular to mounting surface 12a. In order to more reliably achieve the mounting stability effect described later, thickness-direction dimension t of each of first joining member 20a and second joining member 20b is determined in accordance with the average grain size of spherical cores 24. It is preferable that thickness-direction dimension t of each of first joining member 20a and second joining member 20b is smaller than about twice as large as the average grain size of spherical cores 24.

It is preferable that thickness-direction dimension t of each of first joining member 20a and second joining member 20b is equal to or greater than about 35 μm and equal to or less than about 110 μm, for example. In other words, spherical cores 24 included in each of first joining member 20a and second joining member 20b are not arranged to be stacked on one another in the thickness direction of each of first joining member 20a and second joining member 20b, but are arranged in one row uniformly inside each of first joining member 20a and second joining member 20b. This can further improve the mounting stability in mounting chip electronic component 10 on a substrate.

Furthermore, first joining member 20a is electrically connected to first external electrode 18a while second joining member 20b is electrically connected to second external electrode 18b. More specifically, as shown in FIGS. 1 to 4, first joining member 20a includes a portion that comes into contact with first external electrode 18a disposed on the mounting surface side, and first joining member 20a is disposed such that this portion is covered. Second joining member 20b includes a portion that comes into contact with second external electrode 18b and is disposed such that this portion is covered.

In chip electronic component 10 shown in FIG. 1, first joining member 20a is electrically connected to first external electrode 18a, second joining member 20b is electrically connected to second external electrode 18b, and spherical cores 24 are included in each of first joining member 20a and second joining member 20b. Thus, when chip electronic component 10 is mounted on mounting substrate 32 with solder, electronic component main body 10A can be mounted horizontally to mounting substrate 32 and also can be mounted offset in the height direction. Accordingly, the squeal reducing or preventing effect can be achieved, and also, the mounting stability can be improved since electronic component main body 10A is supported by the plurality of spherical cores 24.

2. Electronic Component Mounting Structure

The following is an explanation with reference to FIGS. 5A and 5B of an electronic component mounting structure in which the above-described chip electronic component 10 is mounted on mounting substrate 32.

Electronic component mounting structure includes chip electronic component 10 and mounting substrate 32, for example, as shown in FIGS. 5A and 5B. Mounting substrate 32 includes a substrate main body 34. Substrate main body 34 is made, for example, of a resin such as glass epoxy, or ceramic such as glass ceramic. Substrate main body 34 may include a plurality of stacked insulator layers, for example. Substrate main body 34 includes one main surface defining and functioning as a substrate-side mounting surface. On substrate-side mounting surface, a first conductive land 36a and a second conductive land 36b are disposed so as to correspond to first external electrode 18a and second external electrode 18b, respectively. When chip electronic component 10 is mounted on mounting substrate 32, first joining member 20a is electrically connected and mechanically joined to first conductive land 36a via solder 38, and second joining member 20b is electrically connected and mechanically joined to conductive land 36b via solder 38. Solder 38 forms a fillet along the side surface of each of first joining member 20a and second joining member 20b.

When chip electronic component 10 is mounted on mounting substrate 32 via solder 38, no spherical core 24 is disposed on the fillet portion. In other words, no spherical core 24 exists between first main surface 12a and second main surface 12b of multilayer body 12 in height direction x.

Furthermore, a distance P (a fillet wetting height) is defined in height direction x from the flat plane extending from first main surface 12a of multilayer body 12 to an edge 38a of the solder disposed on first external electrode 18a located on end surface 12e and sides surfaces 12c and 12d of multilayer body 12 or second external electrode 18b located on end surface 12f and sides surfaces 12c and 12d of multilayer body 12. This distance P is preferably equal to or less than about 320 μm, for example.

Furthermore, a distance Q in length direction z of solder 38 located on the surface of conductive land 36a (the length of the fillet located on the surface of the conductive land) is defined from the surface of first external electrode 18a located on first end surface 12e of electronic component main body 10A to an edge 38b of solder 38 located on the surface of conductive land 36a. Also, a distance Q in length direction z of solder 38 located on the surface of conductive land 36b (the length of the fillet located on the surface of the conductive land) is defined from the surface of second external electrode 18b located on second end surface 12f of electronic component main body 10A to an edge 38b of solder 38 located on the surface of conductive land 36b. This distance Q is preferably equal to or less than about 140 μm, for example.

According to electronic component mounting structure shown in FIGS. 5A and 5B, chip electronic component 10 including first joining member 20a and second joining member 20b each including spherical cores 24 is mounted on mounting substrate 32. Thus, when chip electronic component 10 is mounted on mounting substrate 32 with solder 38, electronic component main body 10A can be mounted horizontally to mounting substrate 32 and also can be mounted offset in the height direction. Accordingly, the squeal reducing or preventing effect can be achieved, and also, the mounting stability can be improved since electronic component main body 10A is supported by the plurality of spherical cores 24.

3. Method of Manufacturing Chip Electronic Component

The following is an explanation of an example of the process of manufacturing an electronic component main body (a multilayer ceramic capacitor) of chip electronic component 10.

First, dielectric sheets and a conductive paste for internal electrode are prepared. The dielectric sheets and the conductive paste for internal electrode include a binder and a solvent, which may be a well-known organic binder and organic solvent, for example.

Then, the conductive paste for internal electrode is printed in a prescribed pattern on the dielectric sheet, for example, by screen printing or gravure printing, thus forming an internal electrode pattern.

Furthermore, a prescribed number of dielectric sheets for outer layer each having no internal electrode pattern formed thereon are stacked one on one another, on which dielectric sheets each having an internal electrode formed thereon are sequentially stacked, on which a prescribed number of dielectric sheets for outer layer are stacked, thus forming a multilayer sheet.

The multilayer sheet thus obtained is then pressed in the stacking direction by, for example, hydrostatic pressing, thus forming a multilayer block.

Then, the multilayer block is cut into multilayer chips having a prescribed size. In this case, the corners and ridges of the multilayer chip may be rounded by barrel polishing or the like, for example.

Furthermore, the multilayer chip is fired to form multilayer body 12. The firing temperature at this time is prefer-ably, for example, equal to or higher than about 900° C. and equal to or lower than about 1300° C. depending on the materials of the dielectric and the internal electrode.

A conductive paste for external electrode is applied to both end surfaces of the obtained multilayer body 12, which is then baked to form a baked layer for external electrode. The baking temperature at this time is preferably equal to or higher than about 700° C. and equal to or lower than about 900° C., for example.

Furthermore, the surface of the baked layer made of the conductive paste for external electrode is plated as required.

As described above, a multilayer ceramic capacitor as electronic component main body 10A is fabricated.

The following is an explanation with reference to FIGS. 6A to 6E about an example of a joining member formation process of forming first joining member 20a and second joining member 20b on electronic component main body (multilayer ceramic capacitor) 10A obtained by the above-described process.

[Step 1]: Alignment of Electronic Component Main Bodies

Figure 6A:
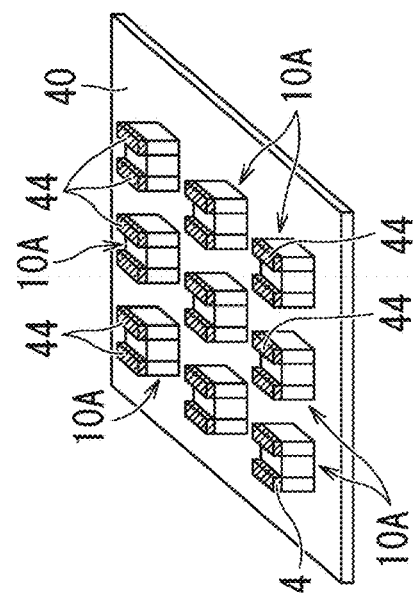
FIGS. 6A to 6E show a process illustrating main portions of an example of a method of manufacturing a chip electronic component according to a preferred embodiment of the present invention, as a flowchart showing an example in which a joining member is formed on an electronic component main body.

First, as shown in FIG. 6A, electronic component main bodies 10A are aligned at prescribed positions on a holding substrate 40, using a suction nozzle 42.

Holding substrate 40 is capable of holding electronic component main bodies 10A and has heat resistance. Holding substrate 40 is preferably formed, for example, by attaching a double-sided tape made of polyimide onto an alumina plate to which a metallic material paste cannot be joined under reflow conditions.

[Step 2]: Joining Member Formation Process

Then, a metallic material paste 44 used as a material of first joining member 20a and second joining member 20b is prepared. The metallic material paste is made of a solder material including spherical cores. The solder material is preferably made, for example, using Sn—Sb based, Sn—Ag—Cu based, Sn—Cu based, or Sn—Bi based LF solder. The melting point of the solder material is preferably lower than about 300° C., for example. The spherical cores are preferably metal such as Ni and Cu, or a resin, for example. When the spherical cores are made of a resin, it is preferable that the surface of the resin is plated in advance.

Figure 6B:
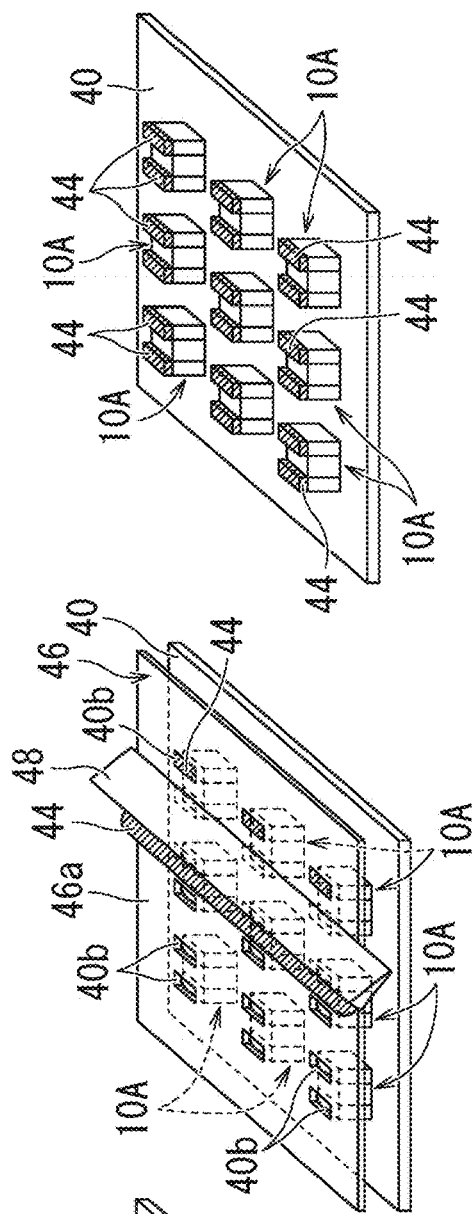

As shown in FIG. 6B, metallic material paste 44 is formed in a desired pattern by, for example, screen printing, using a squeegee 48, on electronic component main bodies 10A aligned on holding substrate 40.

For this purpose, for example, a masking jig 46 is prepared and placed on electronic component main bodies 10A aligned on holding substrate 40. As shown in FIG. 6B, masking jig 46 includes a mask plate 46a having a rectangular or substantially rectangular shape in plan view, for example. Mask plate 46a includes a plurality of through holes 40b passing therethrough from one main surface to the other main surface. Through holes 40b each have a rectangular or substantially rectangular shape in plan view. This rectangular or substantially rectangular shape in plan view determines the size of each joining member.

Figure 6C:
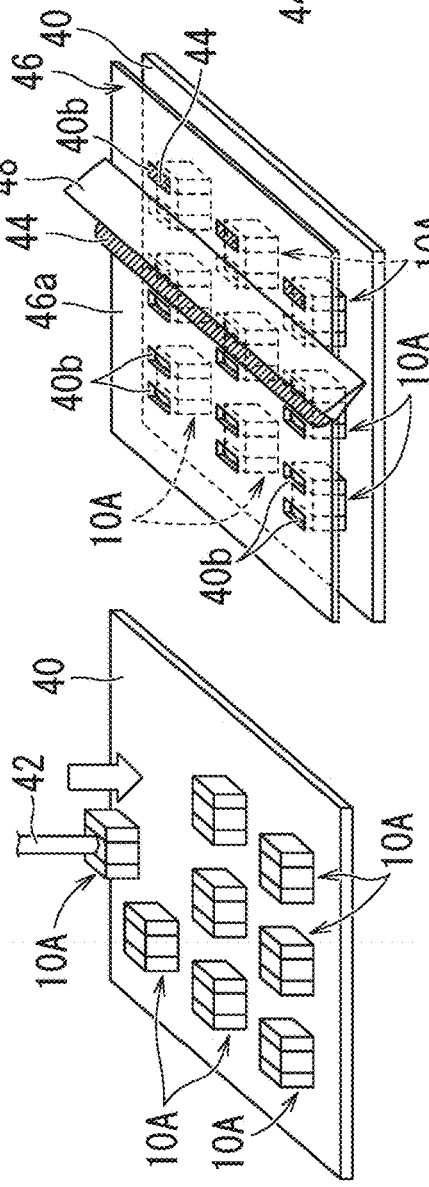

Then, as shown in FIG. 6C, metallic material paste 44 is formed to partially cover external electrodes 18a and 18b of each electronic component main body 10A.

Another way of forming a joining member in a desired pattern with metallic material paste 44 may be, for example, a dispensing method and the like, by which metallic material paste 44 can be applied in a prescribed pattern using a dispenser.

[Step 3]: Reflow Process

Figure 6D:
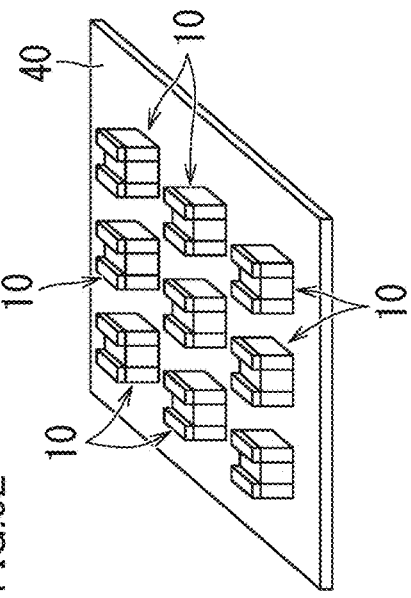

Then, as shown in FIG. 6D, a reflow process is performed in the state where metallic material pastes 44 are formed on electronic component main bodies 10A. Thus, the metal included in each metallic material paste 44 is joined to the external electrode.

[Step 4]: Separation Process After Thermal Curing

Figure 6E:
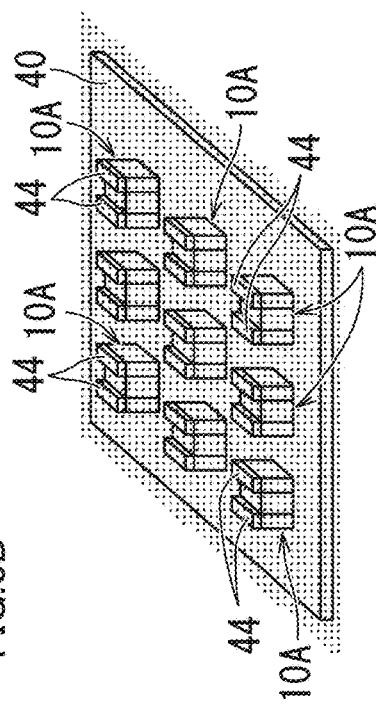

After thermal curing, as shown in FIG. 6E, multilayer body 12 and joining members 20a and 20b joined to respective external electrodes 18a and 18b are formed to form chip electronic components 10. Then, chip electronic components 10 each are separated from holding substrate 40.

By the method as described above, chip electronic component 10 including joining members 20a and 20b is manufactured.

Each joining member is formed on electronic component main body 10A by the above-described method, but a joining member may be formed on a conductive land, on which electronic component main body 10A may be mounted so as to fabricate an electronic component mounting structure.

4. Electronic Component Assembly

Figure 7:
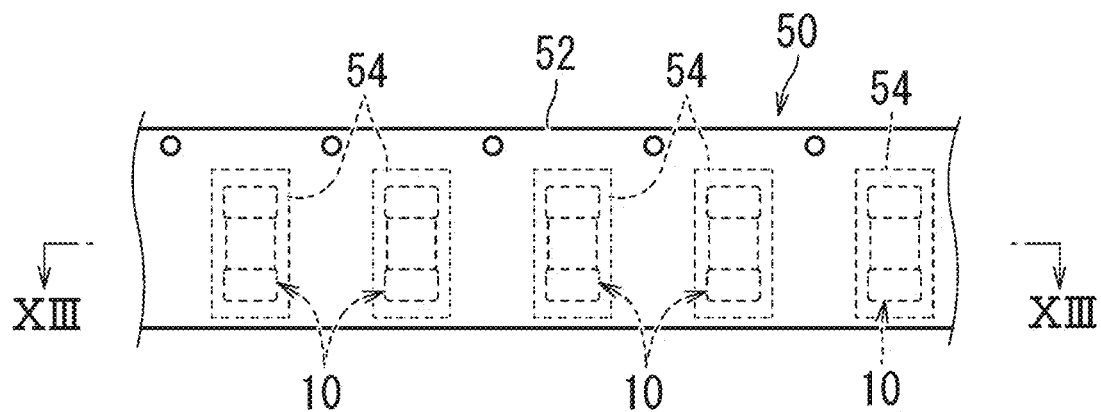
FIG. 7 is a plan view of an electronic component assembly according to a preferred embodiment of the present invention.
Figure 8:
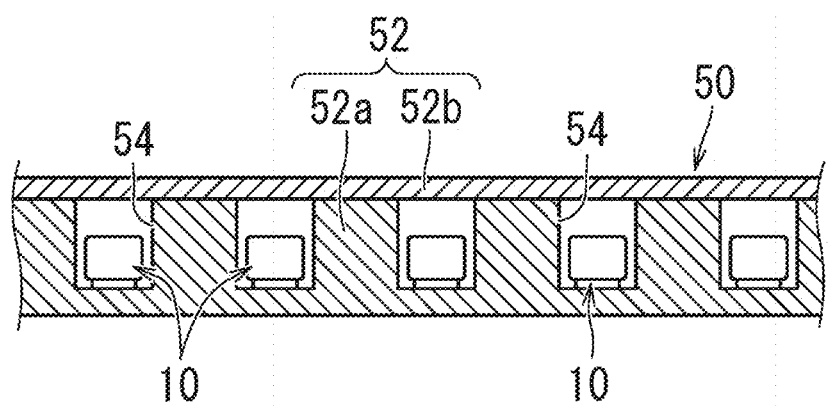
FIG. 8 is a cross-sectional view taken along a line XIII-XIII in FIG. 7.

An electronic component assembly 50 shown in FIGS. 7 and 8 is provided by taping a plurality of chip electronic components 10. Electronic component assembly 50 includes an elongated tape 52. As shown in FIG. 8, tape 52 includes an elongated carrier tape 52a and an elongated cover tape 52b. Carrier tape 52a includes a plurality of cavities 54 disposed spaced apart from one another in the length direction. Cover tape 52b is disposed on carrier tape 52a so as to cover cavities 54. Chip electronic component 10 is accommodated in each of cavities 54.

In such electronic component assembly 50, chip electronic components 10 are aligned, for example, using a conveying apparatus (not shown) for chip electronic components 10 and then accommodated in respective cavities 54 in carrier tape 52a. Cavities 54 each accommodating chip electronic component 10 are then covered with cover tape 52b.

Thus, electronic component assembly 50 is manufactured.

5. Experimental Example

The following is an explanation of an experimental example that was performed to check the "squeal" reducing or preventing effect achieved by chip electronic component 10 included in the multilayer ceramic capacitor according to the present preferred embodiment.

(1) Sound Pressure Measurement Device

Figure 9:
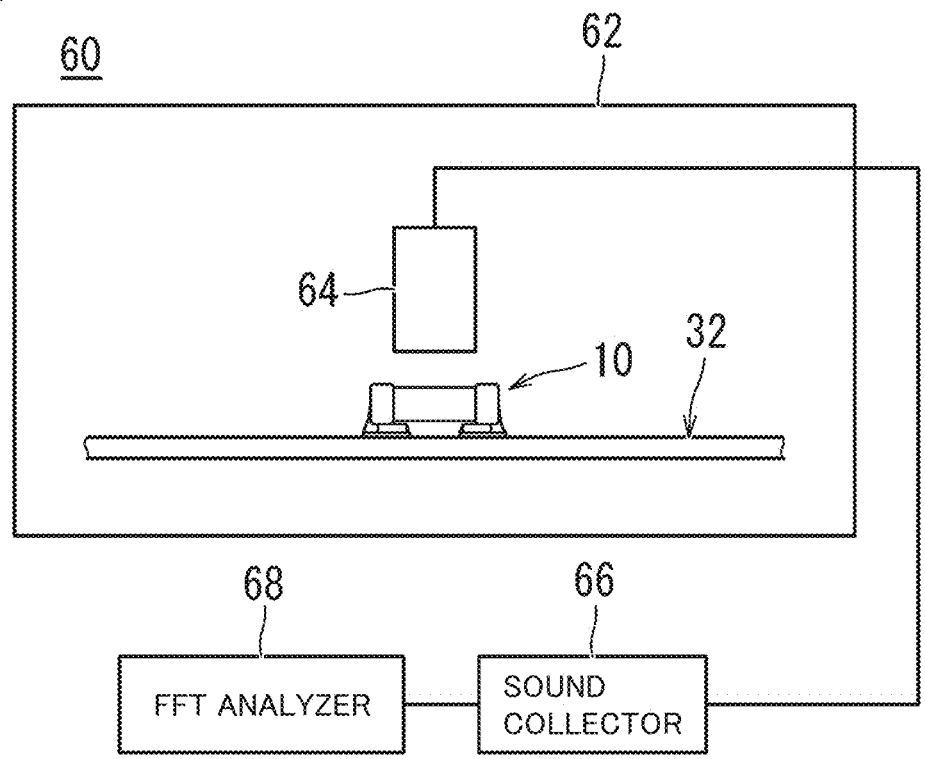
FIG. 9 is a diagram schematically showing a measurement device that measures a sound pressure level of noise generated by "squealing" on the electronic component mounting structure.
Figure 10:
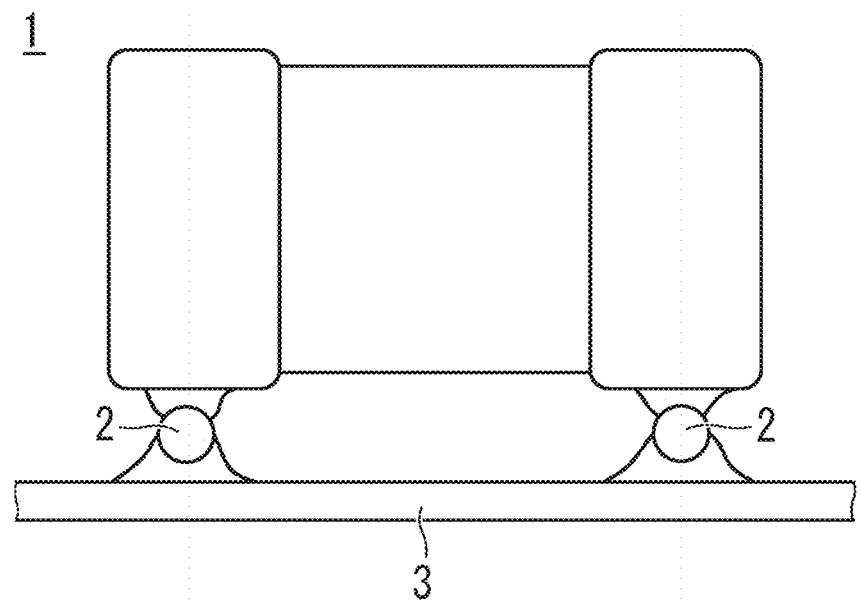
FIG. 10 is a cross-sectional view of a conventional electronic component for countermeasures against "squealing".

FIG. 9 shows a sound pressure measurement device 60 that measures the sound pressure level of noise generated by "squealing" of chip electronic component 10 included in the multilayer ceramic capacitor.

Referring to FIG. 9, mounting substrate 32 including chip electronic component 10 mounted thereon is installed inside an anechoic box 62. Also, a sound collecting microphone 64 is disposed to face mounting substrate 32. Then, an alternating-current (AC) voltage having, for example, a frequency of about 3 kHz and a voltage of about 1 Vpp is applied to chip electronic component 10 included in the multilayer ceramic capacitor. Thus, chip electronic component 1 deforms mounting substrate 32 under the above-described frequency to produce noise of "squeal". The noise was collected by sound collecting microphone 64, and the output from sound collecting microphone 64 was input via a sound collector 66 to a fast Fourier transform (FFT) analyzer 68 that then analyzed the sound pressure level. Mounting substrate 32 was a glass epoxy substrate. The thickness of mounting substrate 32 was about 1.6 mm.

(2) Specifications of Samples in Experimental Example

First, an electronic component main body (a multilayer ceramic capacitor) having specifications as described below was manufactured according to the above-described method of manufacturing a multilayer ceramic capacitor.

The multilayer body had dimensions of L×W×T of about 1.0 mm×about 0.5 mm×about 0.5 mm (setting values). The internal electrode had a thickness of about 0.6 μm, and the ceramic layer had a thickness of about 0.7 μm. The number of stacked layers was about 300. The dielectric constant was about 2500 and the capacitance was about 2.2 μF. The external electrode included an underlying electrode layer and a plating layer. The underlying electrode layer was made of Cu. The plating layer had a two-layer structure including an Ni-plated layer and an Sn-plated layer. The external electrode had a thickness of about 10 μm or more and about 50 μm or less.

As shown in Table 1, the prepared samples of the multilayer ceramic capacitors used in the experiment example included spherical cores having different diameters. Sample number 1 was prepared to include a joining member including no spherical core. The diameters of the spherical cores in the respective samples were: about 25 μm for sample number 2; about 40 μm for sample number 3; about 50 μm for sample number 4; about 60 μm for sample number 5; about 75 μm for sample number 6; about 100 μm for sample number 7; about 125 μm for sample number 8; about 150 μm for sample number 9; and about 200 μm for sample number 10.

Also, four samples were prepared for each of the sizes of the spherical cores.

The number of spherical cores shown in Table 1 shows the number of spherical cores included in one of the joining members. Table 1 shows the results of measuring the sound pressure level for each of the samples including the joining members including spherical cores having different diameters. It should be noted that any sample having a sample number marked with an asterisk (*) in the table is outside the scope of the present invention.

TABLE 1

| Sample Number | Spherical Core | | Dimension of Joining Member in Thickness Direction: t (μm) | Sound Pressure Level (dB) |
|---|---|---|---|---|---|
| | Material | Diameter (μm) | Number (Pieces) | | |
| *1 | — | — | — | 10 | 60.8 |
| 2 | Cu | 25 | 65 | 35 | 54.7 |
| 3 | Cu | 40 | 27 | 50 | 47.9 |
| 4 | Cu | 50 | 21 | 60 | 38.1 |
| 5 | Cu | 60 | 12 | 70 | 38.8 |
| 6 | Cu | 75 | 10 | 85 | 48.4 |
| 7 | Cu | 100 | 4 | 110 | 55.0 |
| 8 | Cu | 125 | 3 | 135 | 57.6 |
| 9 | Cu | 150 | 3 | 160 | 59.3 |
| 10 | Cu | 200 | 2 | 210 | 60.4 |

As a result of the experiment by the sound pressure measurement device, the samples each including a joining member including spherical cores in diameter of about 25 μm or more and about 100 μm or less achieved an excellent sound pressure level of about 55 dB or less, as shown in Table 1.

On the other hand, the joining member including no spherical core achieved a sound pressure level of about 60.8 dB. Furthermore, the sound pressure levels for each of the diameters of the spherical cores included in the respective joining members were: about 57.6 dB in the case of the diameter of about 125 µm, i.e., over about 100 µm; about 59.3 dB in the case of the diameter of about 150 µm; and about 60.4 dB in the case of the diameter of about 200 µm. In each of the cases, the sound pressure level was relatively low as compared with the sample including no spherical core.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
    a multilayer body including a plurality of ceramic layers that are stacked on one another and a plurality of internal electrodes that are stacked on the respective ceramic layers, the multilayer body including a first main surface and a second main surface that face each other in a height direction, a first side surface and a second side surface that face each other in a width direction orthogonal or substantially orthogonal to the height direction, and a first end surface and a second end surface that face each other in a length direction orthogonal or substantially orthogonal to the height direction and the width direction;
    a first external electrode disposed on at least the first end surface and the first main surface of the multilayer body;
    a second external electrode disposed on at least the second end surface and the first main surface of the multilayer body;
    a first joining member electrically connected to the first external electrode; and
    a second joining member electrically connected to the second external electrode; wherein
    the plurality of internal electrodes face each other in the height direction;
    the first joining member is disposed only on a portion of the first external electrode that is disposed on the first main surface side without the multilayer ceramic capacitor being mounted on a mounting substrate;
    the second joining member is disposed only on a portion of the second external electrode that is disposed on the first main surface side without the multilayer ceramic capacitor being mounted on a mounting substrate;
    each of the first joining member and the second joining member includes a solder material and a plurality of spherical cores;
    the plurality of spherical cores are made of Cu or Ni; and
    the plurality of spherical cores are arranged in one row inside each of the first joining member and the second joining member.

2. The multilayer ceramic capacitor according to claim 1, wherein an average grain size of the plurality of spherical cores is equal to or greater than about 25 µm and equal to or less than about 100 µm.

3. The multilayer ceramic capacitor according to claim 1, wherein a dimension of each of the first joining member and the second joining member in the height direction is equal to or less than about twice as large as an average grain size of the plurality of spherical cores.

4. The multilayer ceramic capacitor according to claim 1, wherein a melting point of the solder material of the first and second joining members is lower than about 300° C.

5. The multilayer ceramic capacitor according to claim 1, wherein the first main surface and the second main surface each extend in parallel or substantially in parallel with the plurality of internal electrodes.

6. The multilayer ceramic capacitor according to claim 1, wherein the plurality of spherical cores are not disposed between the first main surface and the second main surface of the multilayer body in the height direction.

7. An electronic component mounting structure comprising:
    the multilayer ceramic capacitor according to claim 1; and
    a mounting substrate including a substrate main body including a mounting surface, and a conductive land provided on the mounting surface; wherein
    in a state where the mounting surface of the mounting substrate faces the first main surface of the multilayer ceramic capacitor, each of the first joining member and the second joining member of the multilayer ceramic capacitor is mounted on the conductive land via solder.

8. The electronic component mounting structure according to claim 7, wherein an average grain size of the plurality of spherical cores is equal to or greater than about 25 µm and equal to or less than about 100 µm.

9. The electronic component mounting structure according to claim 7, wherein a dimension of each of the first joining member and the second joining member in the height direction is equal to or less than about twice as large as an average grain size of the plurality of spherical cores.

10. The electronic component mounting structure according to claim 7, wherein a melting point of the solder material of the first and second joining members is lower than about 300° C.

11. The electronic component mounting structure according to claim 7, wherein the first main surface and the second main surface each extend in parallel or substantially in parallel with the plurality of internal electrodes.

12. The electronic component mounting structure according to claim 7, wherein the plurality of spherical cores are not disposed between the first main surface and the second main surface of the multilayer body in the height direction.

13. An electronic component assembly comprising:
    a plurality of the multilayer ceramic capacitors according to claim 1; and
    a carrier tape including a plurality of cavities each accommodating the plurality of multilayer ceramic capacitors; wherein
    the first main surface on which the first joining member and the second joining member of each of the plurality of multilayer ceramic capacitors is located is disposed to face a side of bottom surfaces of the plurality of cavities.

14. The electronic component assembly according to claim 13, wherein an average grain size of the plurality of spherical cores is equal to or greater than about 25 µm and equal to or less than about 100 µm.

15. The electronic component assembly according to claim 13, wherein a dimension of each of the first joining member and the second joining member in the height direction is equal to or less than about twice as large as an average grain size of the plurality of spherical cores.

16. The electronic component assembly according to claim 13, wherein a melting point of the solder material of the first and second joining members is lower than about 300° C.

* * * * *